(12) United States Patent
Lim et al.

(10) Patent No.: US 9,568,164 B2
(45) Date of Patent: Feb. 14, 2017

(54) LIGHT-EMITTING DEVICE WITH AIR RING

(71) Applicant: Avago Technologies General IP (Singapore) Pte. Ltd., Singapore (SG)

(72) Inventors: Sook Choo Lim, Penang (MY); Kum Soon Wong, Penang (MY); Yean Chon Yaw, Penang (MY)

(73) Assignee: Avago Technologies General IP (Singapore) Pte. LM., Singapore (SG)

( * ) Notice: Subject to any disclaimer, the term of this patent is extended or adjusted under 35 U.S.C. 154(b) by 103 days.

(21) Appl. No.: 14/592,697

(22) Filed: Jan. 8, 2015

(65) Prior Publication Data
US 2016/0201857 A1    Jul. 14, 2016

(51) Int. Cl.
| F21V 7/00 | (2006.01) |
| F21V 7/22 | (2006.01) |
| H01L 33/00 | (2010.01) |

(52) U.S. Cl.
CPC . *F21V 7/22* (2013.01); *F21K 9/64* (2016.08); *H01L 33/00* (2013.01)

(58) Field of Classification Search
CPC .............. F21K 9/56; F21K 9/135; F21K 9/64
USPC .................... 362/84; 313/501–502
See application file for complete search history.

(56) References Cited

U.S. PATENT DOCUMENTS

| 7,394,188 | B2 | 7/2008 | Ouderkirk et al. | |
| 2010/0172122 | A1* | 7/2010 | Ramer | F21K 9/00 362/84 |
| 2012/0057327 | A1* | 3/2012 | Le | F21K 9/135 362/84 |
| 2014/0183584 | A1 | 7/2014 | Tong et al. | |

OTHER PUBLICATIONS

Dr. Yosi Shani, "Fundamentals of Planar Remote Phosphor LEDs", Planar Remote Phosphor, Issue 29, Luger Research e.U., 2012, 4 pages.

* cited by examiner

Primary Examiner — Karabi Guharay

(57) ABSTRACT

In one embodiment, a light-emitting device having a reflector cup, a light source die, a wavelength-converting layer, an optical structure, and an encapsulant is disclosed. The wavelength-converting layer may be configured to convert a narrow band light emitted from the light source die into a broad band light before the light is directed towards a first direction. The optical element may be an air ring embedded within the encapsulant and may be arranged circumscribing the wavelength-converting layer. In another embodiment, a light-emitting device with extended wavelength-converting layer in place of the air ring is presented.

20 Claims, 9 Drawing Sheets

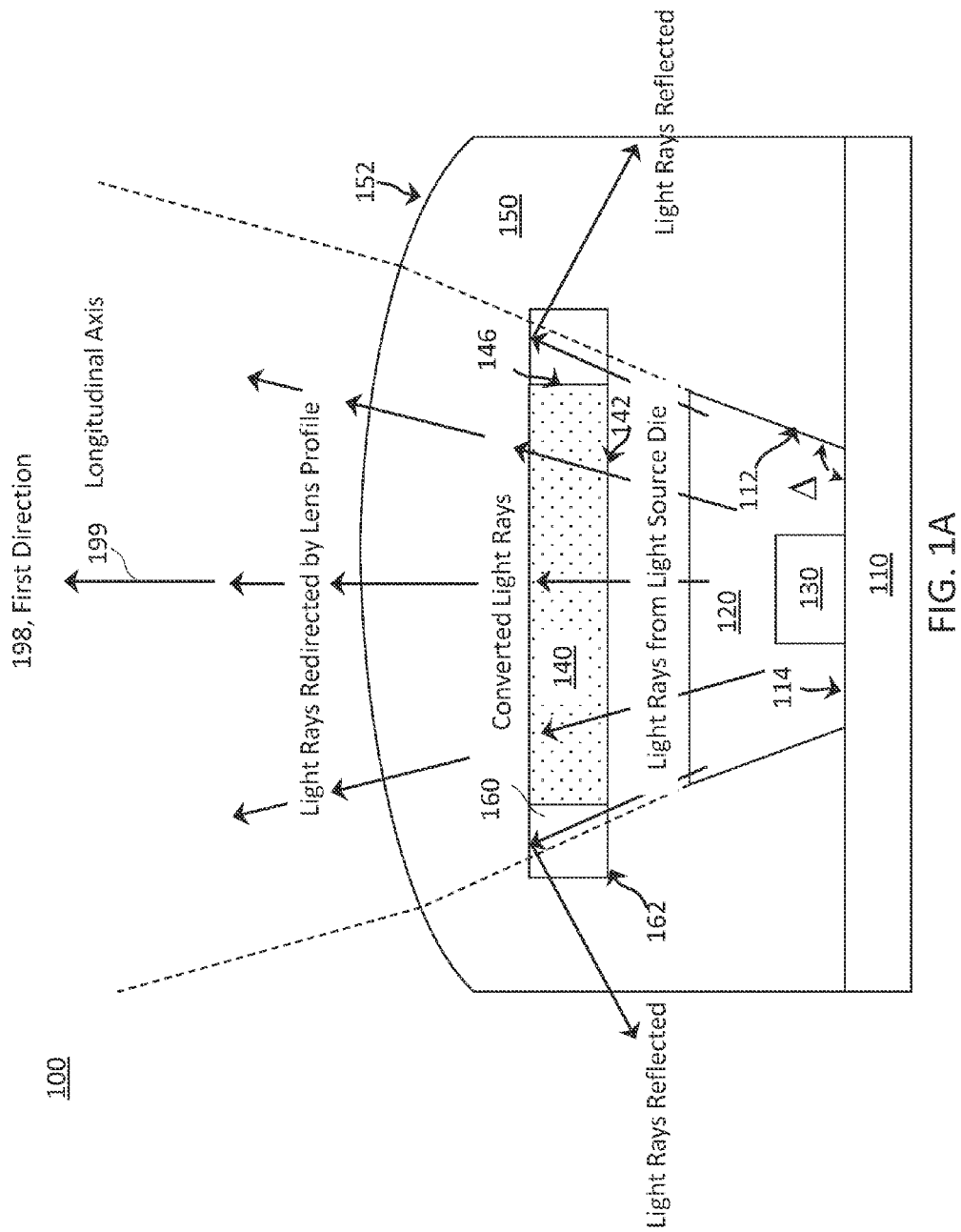

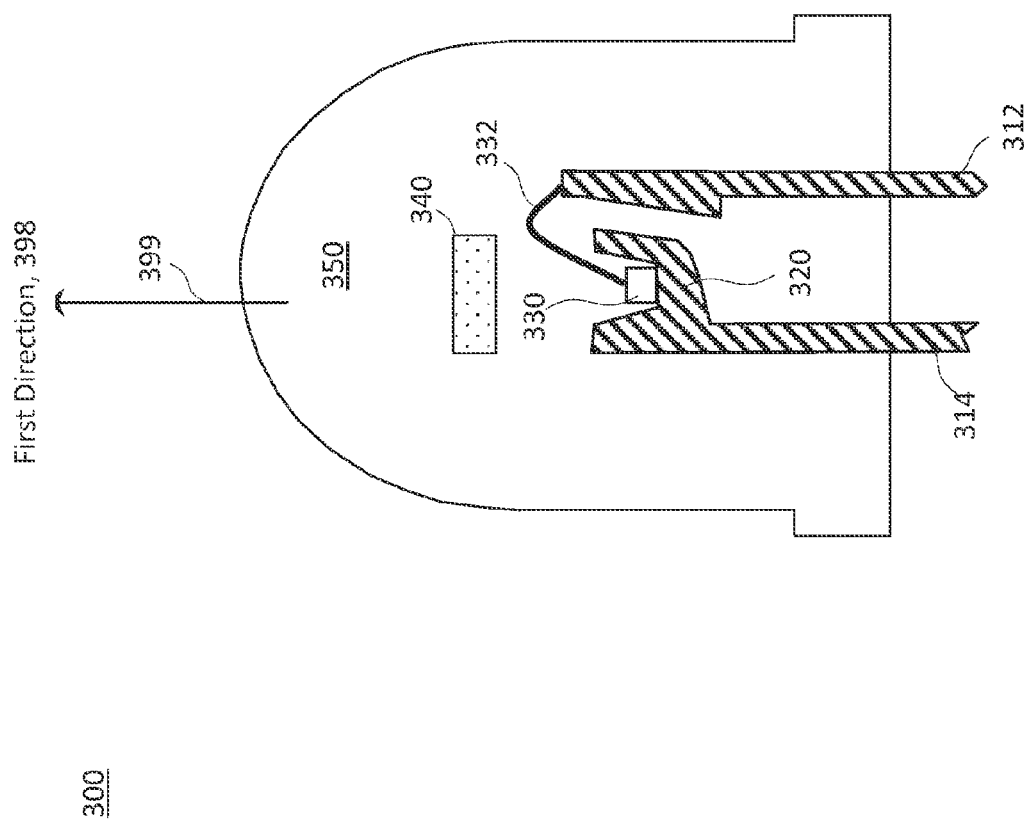

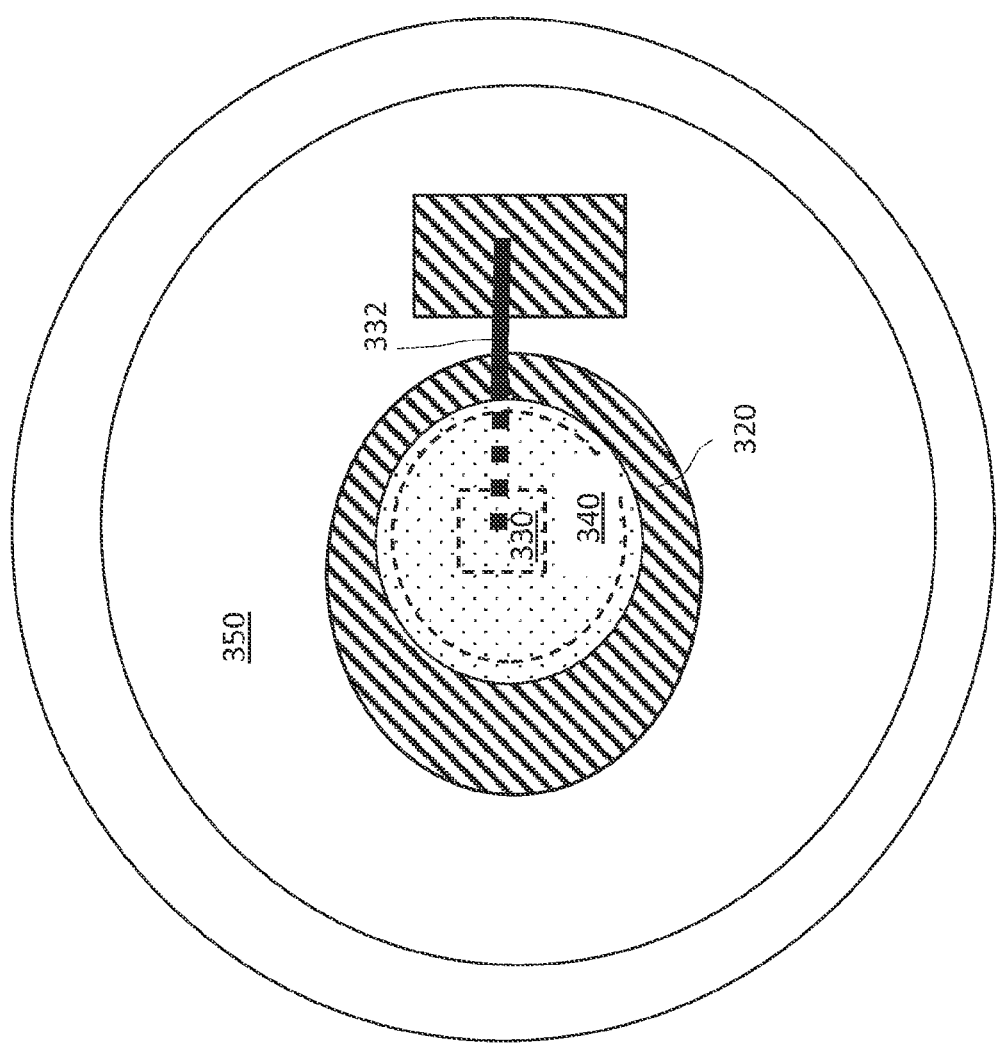

LIGHT-EMITTING DEVICE WITH AIR RING

BACKGROUND

A light-emitting diode ("LED") represents one of the most popular light-emitting devices today. In recent years, the luminous efficacy of LEDs, defined in lumens per Watt, has increased significantly from 20 lumens per Watt (approximately the luminous efficacy of an incandescent light bulb) to over 500 lumens per Watt, which greatly exceeds the luminous efficacy of a fluorescent light at 60 lumens per Watt. In addition to the luminous efficacy, LEDs may be superior or preferable compared to traditional light sources because of their small form factor, which enables an optical lens may be placed in close proximity to the light sources. Various optical designs that were not possible with traditional light sources may become possible with LEDs. With new optical designs, LEDs are poised to become one of the most appealing light sources.

Usually, color and brightness consistency requirements in LEDs are demanding. Generally speaking, LEDs are susceptible to yellow ring effect, in which light output of an LED may appear yellowish at outer ring. The yellow ring effect may be one of the main reasons why LEDs fail in the uniformity requirements.

BRIEF DESCRIPTION OF THE DRAWINGS

Illustrative embodiments by way of examples, not by way of limitation, are illustrated in the drawings. Throughout the description and drawings, similar reference numbers may be used to identify similar elements. The drawings may be simplified illustrative views rather than precise engineering drawings. The drawings are for illustrative purpose to assist understanding and may not necessarily be drawn per actual scale.

FIG. 1A shows an illustrative block diagram of a light-emitting device having an optical structure;

FIG. 3A illustrates a cross-sectional view of a lamp type light-emitting device with an extended wavelength-converting layer;

FIG. 3B illustrates a top view of the light-emitting device shown in FIG. 3A;

DETAILED DESCRIPTION

Figure 1C:
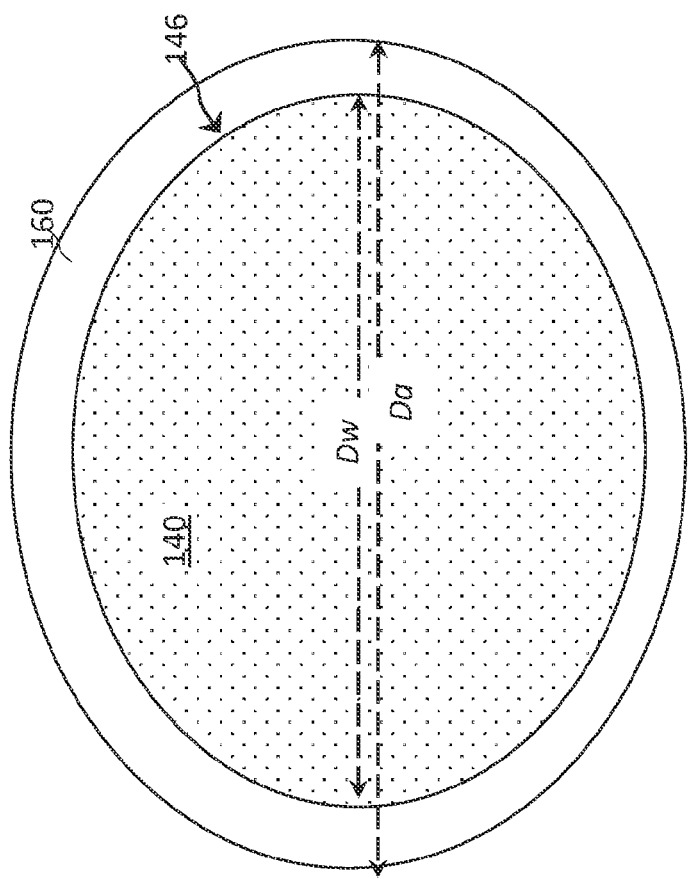
FIG. 1C shows an illustrative block diagram depicting how the wavelength-converting layer and the air ring may be connected.

The ensuing description provides embodiments only, and is not intended to limit the scope, applicability, or configuration of the claims. Rather, the ensuing description will provide those skilled in the art with an enabling description for implementing the described embodiments. It being understood that various changes may be made in the function and arrangement of elements without departing from the spirit and scope of the appended claims.

Various aspects of the present disclosure will be described herein with reference to drawings that are schematic illustrations of idealized configurations. As such, variations from the shapes of the illustrations as a result, for example, manufacturing techniques and/or tolerances, are to be expected. Thus, the various aspects of the present disclosure presented throughout this document should not be construed as limited to the particular shapes of elements (e.g., regions, layers, sections, substrates, etc.) illustrated and described herein but are to include deviations in shapes that result, for example, from manufacturing. By way of example, an element illustrated or described as a rectangle may have rounded or curved features and/or a gradient concentration at its edges rather than a discrete change from one element to another. Thus, the elements illustrated in the drawings are schematic in nature and their shapes are not intended to illustrate the precise shape of an element and are not intended to limit the scope of the present disclosure.

It will be understood that when an element such as a region, layer, section, substrate, or the like, is referred to as being "on" another element, it can be directly on the other element or intervening elements may also be present. In contrast, when an element is referred to as being "directly on" another element, there are no intervening elements present. It will be further understood that when an element is referred to as being "formed" or "established" on another element, it can be grown, deposited, etched, attached, connected, coupled, or otherwise prepared or fabricated on the other element or an intervening element.

Furthermore, relative terms, such as "lower" or "bottom" and "upper" or "top" may be used herein to describe one element's relationship to another element as illustrated in the drawings. It will be understood that relative terms are intended to encompass different orientations of an apparatus in addition to the orientation depicted in the drawings. By way of example, if an apparatus in the drawings is turned over, elements described, as being on the "lower" side of other elements would then be oriented on the "upper" side of the other elements. The term "lower" can, therefore, encompass both an orientation of "lower" and "upper" depending of the particular orientation of the apparatus. Similarly, if an apparatus in the drawing is turned over, elements described as "below" or "beneath" other elements would then be oriented "above" the other elements. The terms "below" or "beneath" can therefore encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and this disclosure.

As used herein, the singular forms "a," "an," and "the" are intended to include the plural forms as well, unless the context clearly indicates otherwise. It will be further understood that the terms "comprise," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items.

Furthermore, various descriptive terms used herein, such as "transparent" should be given the broadest meaning possible within the context of the present disclosure. For example, something that is described as being "transparent" should be understood as having a property allowing no significant obstruction or absorption of electromagnetic radiation in the particular wavelength (or wavelengths) of interest, unless a particular transmittance is provided.

Similarly, the term "light-emitting device" should be given the broadest possible interpretation. For example, light-emitting devices may be implemented using various packaging technologies such as a plastic leaded chip carrier (herein after PLCC) package, a ball grid array package (herein after BGA), a pin grid array package (herein after PGA), a quad flat pack (herein after QFP), a printed circuit board (herein after PCB) package and so on. Certain packages, for example PLCC packages, may comprise a lead frame over a molded polymer material such as Polyphthalamide (herein after PPA), Polyamide or Epoxy resin encapsulant like MG 97. For surface mount type, leads extending from the lead frame may be bent so that the light-emitting devices can be soldered on a substrate without through-holes. Light-emitting devices based on other packaging technologies such as a BGA and PGA may comprise a substrate having conductive traces without a lead frame.

The teaching throughout the specification about a light-emitting device may be applicable to a light source packaging, including at least all various types of packaging technologies discussed above. In addition, a light-emitting device should not be limited to devices for lighting purposes, but also other optical device that may emit a radiation of invisible light. For example, a light-emitting device may comprise a proximity sensor, an encoder or other optical device involving an emitter configured to emit a visible or invisible light.

FIG. 1A shows an illustrative block diagram of a light-emitting device 100. The illustrative light-emitting device 100 is shown to comprise a body 110, a reflector cup 120, a light source die 130, a wavelength-converting layer 140, an optical structure 160, and a first encapsulant 150. The first encapsulant 150 may be encapsulating the light source die 130, the reflector cup 120, and the wavelength-converting layer 140. The first encapsulant 150 may be substantially transparent or translucent. In one embodiment, the first encapsulant 150 may have approximately more than ninety percent of transmissivity. The first encapsulant 150 may comprise substantially silicone material, epoxy or other substantially transparent material. In another embodiment, the first encapsulant 150 may both fill and encapsulate at least a portion of the reflector cup 120. The first encapsulant 150 may comprise a lens portion 152 for directing light transmitted through the wavelength-converting layer 140 towards the first direction 198.

Optionally, the body 110 of the light-emitting device 100 may be a substrate 110 or a printed circuit board depending on the type of package employed. A body 110 may be correspond to a structure for providing support to the light source die 130. For a lamp LED-type packaged light-emitting device 100 that does not have a substrate, the body 110 may be a portion of a conductive lead. The reflector cup 120 of the light-emitting device 100 may be supported on an external printed circuit board through the conductive lead.

The light-emitting device 100 may comprise a base surface 114 configured to receive the light source die 130, and a reflective surface 112 coupled to the base surface 114 such that the reflective surface 112 and the base surface 114 may collectively configured to form the reflector cup 120 extending in a longitudinal axis 109 that is substantially perpendicular to the base surface 114. The body 110 may comprise an opaque material that is highly reflective. The body 110 may be an insulator that may be made from PPA, Polyamide, epoxy resin encapsulant like MG 97 or other similar material. The base surface 114 and the reflective surface 112 may be a portion of the non-conductive body 110 that forms the reflector cup 120. In another embodiment, the base surface 114 and the reflective surface 112 may be a portion of a lead frame that is made to form the reflector cup 120.

The reflector cup 120 may be tapered such that the reflective surface 112 of the reflector cup 120 forms an angle $\Delta$ relative to the base surface 114. The reflector cup 120 may extend longitudinally along a longitudinal axis 199 that point towards the first direction 198. The light source die 130 may be provided within the reflector cup 120. The reflector cup 120 may be configured to direct light emitted from the light source die 130 towards the first direction 198.

The light source die 130 may be a light source or a radiation source such as an LED configured to emit radiation. The light source die 130 may be configured to emit electromagnetic radiation waves that may be invisible to human eyes such as infrared, near infrared, ultra-violet or similar radiation having some other invisible wavelength. Alternatively, the light source die 130 may be configured to emit electromagnetic radiation of a visible wavelength. The light source die 130 may be coupled with the reflector cup 120 and may be configured to emit light towards the first direction 198 along the longitudinal axis 199.

The wavelength-converting layer 140 may be positioned outside the reflector cup 120. The wavelength-converting layer 140 may comprise a first surface 142 facing the light source die 130, at least one an outer edge 146 of the wavelength-converting layer 140 substantially perpendicular to the first surface 142, and an optical structure 160 circumscribing the at least one outer edge 146 of wavelength-converting layer 140. The first surface 142 of the wavelength-converting layer 140 may extend substantially in parallel with the base surface 114. Referring to FIG. 1B and FIG. 1A, the wavelength-converting layer 140 may comprise wavelength-converting material configured to convert light ray with narrow wavelength band with a peak wavelength $\lambda 1$ to a light ray with broad wavelength band. For example, the light ray 148 emitted by the light source die 130 may be blue light having a peak wavelength $\lambda 1$ of 400 nm. However, the light exiting the wavelength-converting material may be white light.

The optical structure 160 may be provided adjacent to the at least one outer edge 146 of the wavelength-converting layer 140. As shown in FIG. 1A, the reflector cup 120 may be configured to direct light emitted by the light source die 130 towards the first direction 198. In contrast, the optical structure 160 may be configured to reflect incident light emitted by the light source die 130 away from the first direction 198. In some embodiments, the optical structure 160 may be configured to direct light towards a direction opposing the first direction 198.

In one embodiment, the optical structure 160 may comprise an air pocket surrounded entirely within the encapsulant 150. In another embodiment, the optical structure 160 may comprise an air ring. The optical structure 160 may be a liquid or a gas whereas the wavelength-converting layer 140 may comprise a solid or semi-solid material. The optical structure 160 may comprise a substantially flat surface 162. The substantially flat surface 162 of the optical structure 160 may be formed adjacent to the substantially flat surface 142 of the wavelength-converting layer 140 such that the substantially flat surface 162 of the optical structure 160 and the substantially flat surface 142 of the wavelength converting layer 140 forms a continuous surface. The substantially flat surface 162 of the optical structure 160 and substantially flat surface 142 of the wavelength-converting layer 140 may face toward the light source die 130 as shown in FIG. 1A.

Figure 1B:
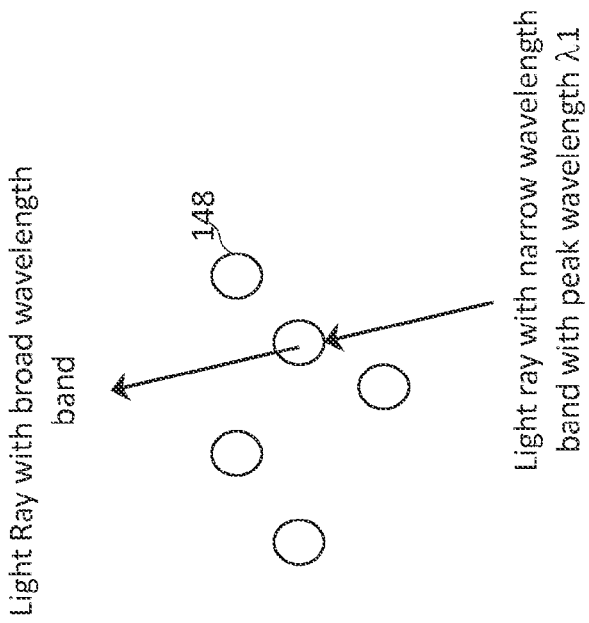
FIG. 1B illustrates how a narrow band light ray is converted into a light ray with a broad wavelength band.

Referring to FIGS. 1A and 1C, the wavelength-converting layer 140 and the optical structure 160 may have a substantially circular shape and may be coaxially aligned with one another. As shown in FIG. 1C, the wavelength-converting layer 140 may have a diameter Dw. The optical structure 160 may have a diameter Da that may be relatively shorter than the diameter Dw of the wavelength-converting layer 140. As the wavelength-converting layer 140 and the optical structure 160 may not be a complete circular shape, the diameter Dw of the wavelength-converting layer 140 and the diameter Da of the optical structure 160 may differ when measured in different radial directions.

With this configuration where the optical structure 160 being configured to reflect light, the light output of the light-emitting device 100 may be more uniform compared to a light-emitting device 100 without the optical structure 160. The specific dimension and arrangement illustrated above may be beneficial in achieving uniform light output. The configuration as shown in the light-emitting device 100 shown in FIG. 1A may be employed to eliminate yellow ring effect.

Figure 2A:
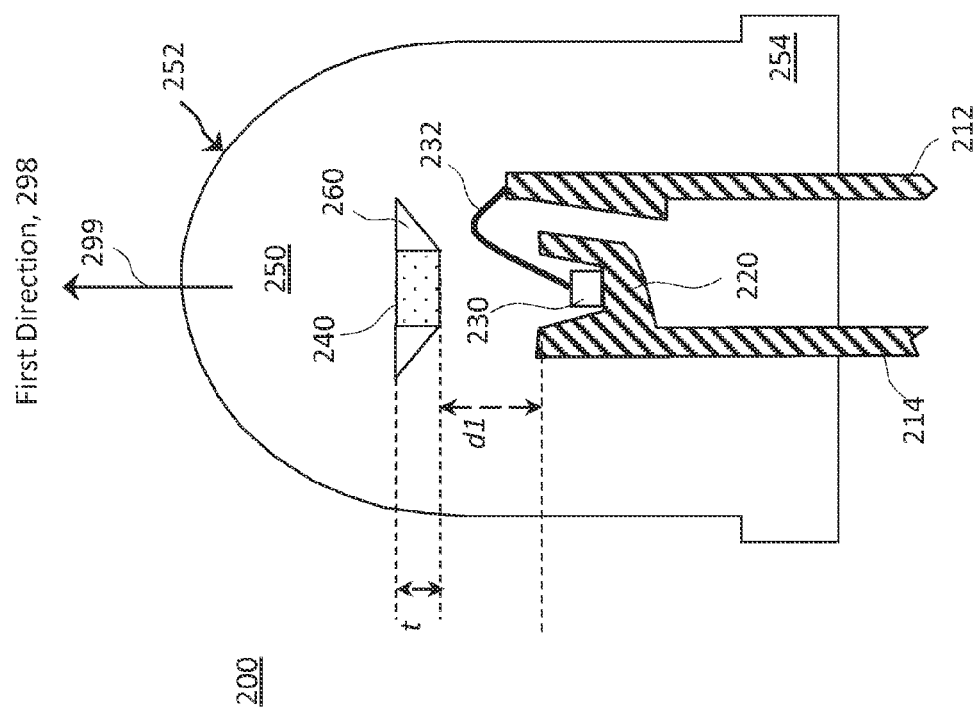
FIG. 2A illustrates a cross-sectional view of a lamp type light-emitting device having a reflective element.

FIG. 2A illustrates a cross-sectional view of a light-emitting device 200. A top view of the light-emitting device 200 is shown in FIG. 2B. The light-emitting device 200 may comprise a plurality of conductors 212, 214, a reflector cup 220, a light source die 230, a wire bond 232, a wavelength-converting layer 240, a reflective element 260 and a substantially transparent encapsulant 250. As shown in FIG. 2B, the wavelength-converting layer 240, and the substantially transparent encapsulant 250 may be concentric. More specifically, the wavelength-converting layer 240 and the substantially transparent encapsulant 250 may be coaxially aligned. The substantially transparent encapsulant 250 may have a base portion 254 that may function as a main supporting structure to hold the light-emitting device 200 on an external surface. The reflector cup 220 may be configured to direct light towards the first direction 298 along the first longitudinal axis 299.

"Conductors" 212, 214 as used herein in reference to the light-emitting device 200 may refer to one or more structures that can electrically connect the light source die 230 to an external power source (not shown). The light-emitting device 200 shown in FIG. 2A may be a lamp LED, and the plurality of conductors 212, 214 may comprise two leads 212, 214 encapsulated partially by the substantially transparent encapsulant 250. For a lamp LED, PLCC package or other packages formed using a molding process, the plurality of conductors 212, 214 may be leads forming part of lead frames but in other packaging technologies, for example printed circuit boards, the plurality of conductors 212, 214 may be electrically conductive traces formed on the PCBs. The scope of the invention should not be limited to any specific forms illustrated, but should be taken into consideration various other technologies, other forms of packaging either presently available, or developed in future.

In the embodiment shown in FIG. 2A, the plurality of conductors 212, 214 may be made of electrically and thermally conductive material, such as steel, copper, metal or a metal alloy, a metal compound or other similar material. The plurality of conductors 212, 214 may be formed using any conventional stamping, cutting, etching or other similar process. For surface mount purposes, the plurality of conductors 212, 214 may be bent to define a bottom portion for attaching to external surfaces (not shown). In the embodiment shown in FIG. 2A, one of the leads 212, 214 may be configured to form the reflector cup 220 whereas the other one of the leads 212, 214 may be configured to receive a wire bond 232 coupled to the light source die 230.

A "body" as used herein in reference to a component of a light-emitting device 200 may refer to a respective primary structure, which provides structural support for other components of the light-emitting device 200. In the embodiment, shown in FIG. 2A, the body may be the substantially transparent encapsulant 250 having a base portion 254 that may be supported on an external substrate. In another embodiment, the body may be a substrate such as a PCB. Each body may be a respective integral single piece structure. The body may be formed using an opaque material such as PPA, polyamide, epoxy resin, plastic and other similar material. The body may be formed encapsulating or surrounding the plurality of conductors 212, 214 using an injection mold or other similar process. The wavelength-converting layer 240 and a portion of the body may be pre-molded during manufacturing process. The pre-molded component may be then inserted into a final mold where the entire body is formed.

Figure 2C:
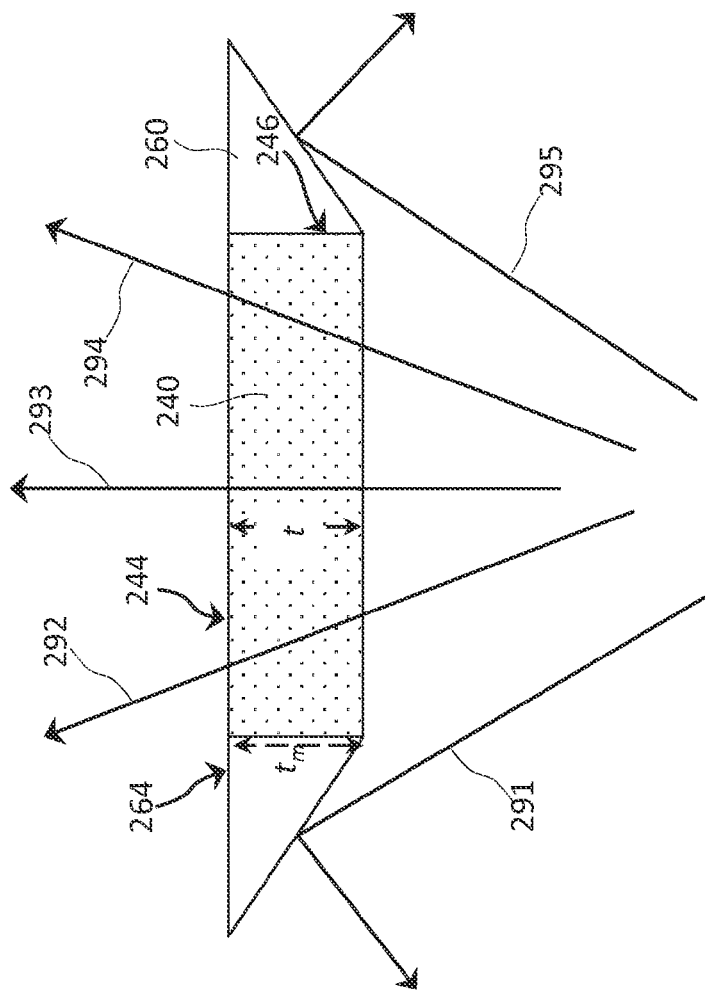
FIG. 2C illustrates how the wavelength-converting layer and the reflective element shown in FIG. 2B operate to direct light.
Figure 2B:
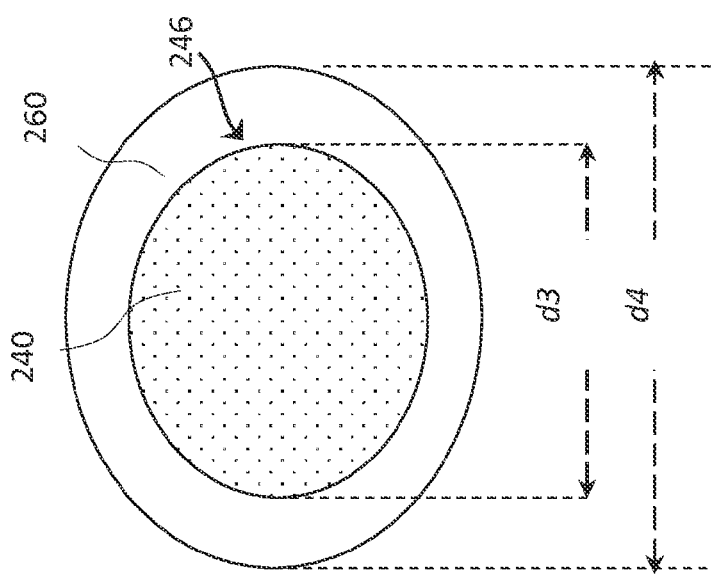
FIG. 2B illustrates a top view of a wavelength-converting layer and a reflective element of the light-emitting device shown in FIG. 2A.
Figure 2D:
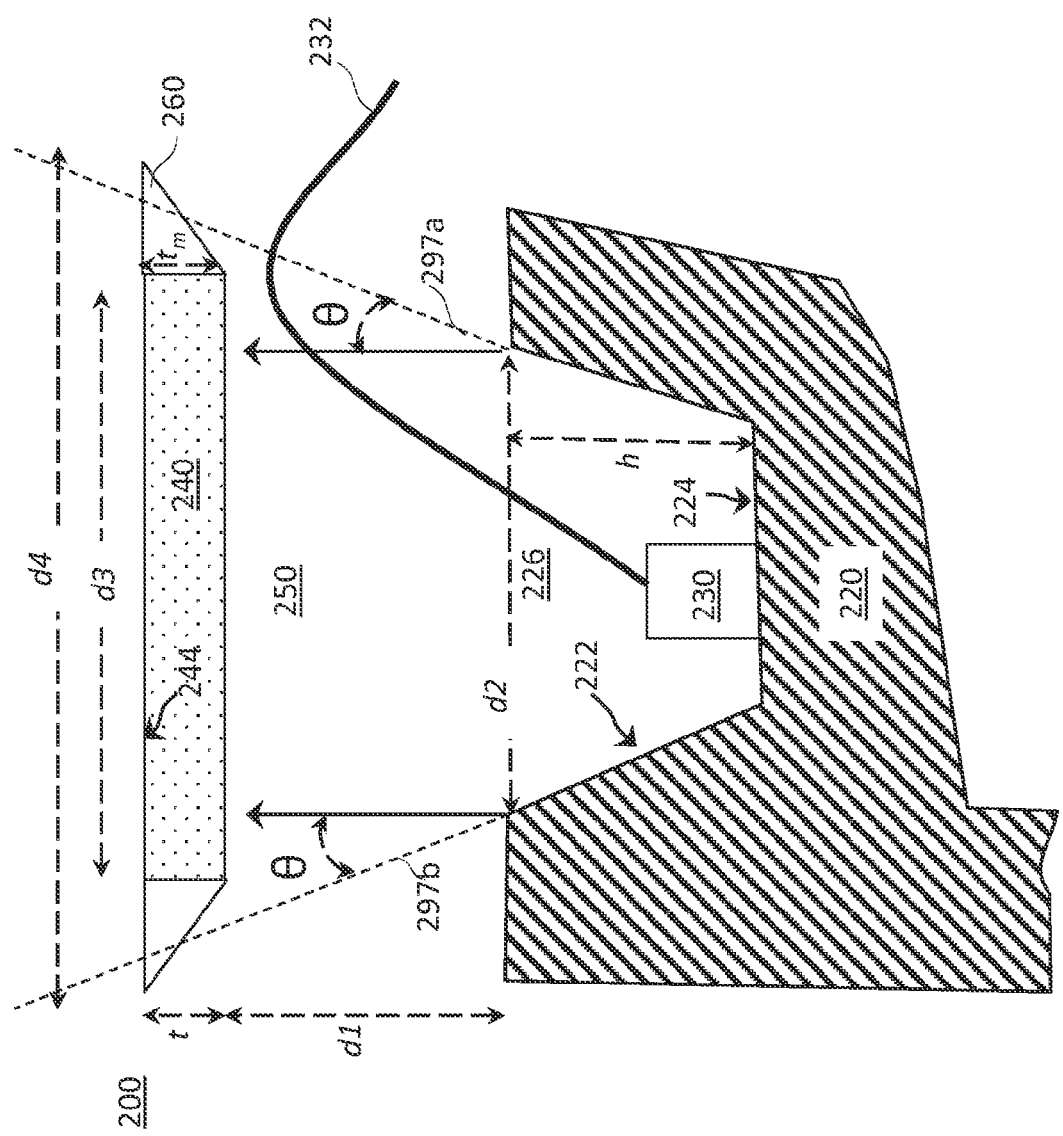
FIG. 2D illustrates a cross sectional view illustrating an arrangement of the wavelength-converting layer relative to a reflector cup.

FIG. 2C is a cross sectional view illustrating the wavelength-converting layer 240. FIG. 2D is a cross sectional view of FIG. 2A illustrating the wavelength-converting layer 240 and the reflector cup 220. Referring to FIGS. 2A-2D, the reflective element 260 may be an air ring or an air pocket surrounded entirely within the substantially transparent encapsulant 250. The reflective element 260 may be an optical structure configured to direct light. The reflective element 260 may circumscribe an outer perimeter 246 of the wavelength-converting layer 240. The reflective element 260 may be concentrically arranged with the wavelength-converting layer 240 and may be in direct contact with the solid material of the wavelength-converting layer 240. The wavelength-converting layer 240 may be in liquid form prior to manufacturing process and may be pre-casted or pre-molded into solid or semi-solid form before the assembly process.

As shown in FIG. 2C, the wavelength-converting layer 240 may comprise a first substantially flat surface 244 facing the first direction 298. The reflective element 260 may comprise a substantially flat surface 264 formed adjacent to the first substantially flat surface 244 of the wavelength-converting layer 240. Both the substantially flat surface 264 of the reflective element 260 and the first substantially flat surface 244 of the wavelength-converting layer 240 may be positioned facing the first direction 298. The substantially flat surface 264 of the reflective element 260 and the first substantially flat surface 244 of the wavelength-converting layer 240 may form a continuous flat surface as shown in FIG. 2C.

With this configuration, light rays 292, 293, 294 passing through the wavelength-converting layer 240 may be directed towards the first direction 298 whereas light rays 291, 295 incident on the reflective element 260 may be reflected back away in a direction opposing the first direction 298. Light rays 292, 293, 294 may be usually more uniform and may appear white in color. In contrast, light rays 291, 295 may appear yellowish white in color and may be more inconsistent in color as compared to light rays 292, 293, 294. By reflecting away light rays 291, 295, the light-emitting device 200 may have a more uniform light output.

Referring to FIGS. 2A, 2C and 2D, the wavelength-converting layer 240 may be configured to taper outwardly in a radial direction away from the wavelength-converting layer 240. The wavelength-converting layer 240 may be a substantially disc-shape plate having a thickness t. The thickness t may be defined as the thickness of the wavelength-converting layer 240 at the outer edge if the wavelength-converting layer 240 does not have a substantially uniformed thickness.

In the embodiment shown in FIG. 2C, the wavelength-converting layer 240 may have a substantially uniform thickness t. The reflective element 260 may have a maximum thickness $t_m$ measuring along an axis in parallel to the longitudinal axis 299. The maximum thickness $t_m$ of the reflective element 260 may be approximately equal to the thickness t of the wavelength-converting layer 240. As the reflective element 260 may be tapering outwardly, the maximum thickness $t_m$ of the reflective element 260 may be located approximately at a boundary of the reflective element 260 that is in direct contact with the outer edge 246 of the wavelength-converting layer 240.

Referring to FIG. 2A and FIG. 2D, the reflector cup 220 may comprise a reflective sidewall 222, a bottom reflective surface 224, an opening 226 located on a top end of the reflector cup 220. The reflector cup 220 may have a cup depth h measuring between the bottom reflective surface 224 and the opening 226. The reflector cup 220 may be shaped so as to direct light towards the first direction 298. The opening 226 of the reflector cup 220 may be configured to allow light to be transmitted towards the first direction 298.

The reflective sidewall 222 may have a conical shape. As shown in FIG. 2D, the reflective sidewall 222 may extend along a virtual surface depicted by virtual lines 297a and 297b in the cross-sectional view. The virtual lines 297a, 297b may form an acute angle θ with an axis parallel to the longitudinal axis 299. Referring to FIG. 2D, the wavelength-converting layer 240 may be positioned at a distance d1 away from the reflector cup 220 measured along the longitudinal axis 299 from the wavelength-converting layer 240 to a top of the reflector cup 220 as shown in FIG. 2D. As can be observed from FIG. 2A, the wire bond 232 may have a first end coupled to the light source die 230 and a second end coupled to the conductor 212 located outside the reflector cup 220. The wavelength-converting layer 240 may be positioned at d1 distanced away from a top of the reflector cup 220 so as to provide a space for the wire bond 232 to travel between the wavelength-converting layer 240 and the top of the reflector cup 220.

The opening 226 of the reflector cup 220 may have a diameter d2. The wavelength-converting layer 240 may have a diameter d3 whereas the reflective element 260 may have an outer diameter d4. The reflective element 260 may be positioned at a distance way from the reflector cup 220 such that at least a portion of the reflective element 260 intersects with the virtual lines 297a, 297b. The size and location of the reflective element 220 may be determined by the distance d1 the angle θ. Consequently, the reflective element 260 may be positioned to intersect a point above the reflector cup 220 that is determined by the distance d1 and the angle θ. In contrast, the diameter d3 of the reflective element 260 may be distanced away and not touching the virtual lines 297a, 297b.

The diameter d4 of the reflective element 260 may be larger than the diameter d3 of the wavelength-converting layer 240. The reflector cup 220 of the light-emitting device 200 may have a cup depth h. In the embodiment shown in FIG. 2D, the cup depth h may be substantially larger than the diameter d2 of the opening 226 of the reflector cup 220. The diameter d3 of the wavelength-converting layer 240 may be approximately equal to the diameter d2 of the opening 226 of the reflector cup 220 so as to avoid light being emitted directly from the light source die 230 towards the first direction 298 without passing through the wavelength-converting layer 240. In general, the diameter d3 of the wavelength-converting layer 240 may be equal to or larger than the diameter d2 of the opening 226 of the reflector cup 220. Consequently, the diameter d4 of the reflective element 260 may be larger than the diameter d2 of the opening 226 of the reflector cup 220.

FIG. 3A illustrates a cross-sectional view of a light-emitting device 300. A top view of the light-emitting device 300 is shown in FIG. 3B. The light-emitting device 300 may comprise a plurality of conductors 312, 314, a reflector cup 320, a light source die 330, a wire bond 332, a wavelength-converting layer 340, and a substantially transparent encapsulant 350. The light-emitting device 300 may be substantially similar to the light-emitting device 200 but may differ at least in that the light-emitting device 300 does not have an optical structure or a reflective element surrounding the wavelength-converting layer 340.

Figure 3C:
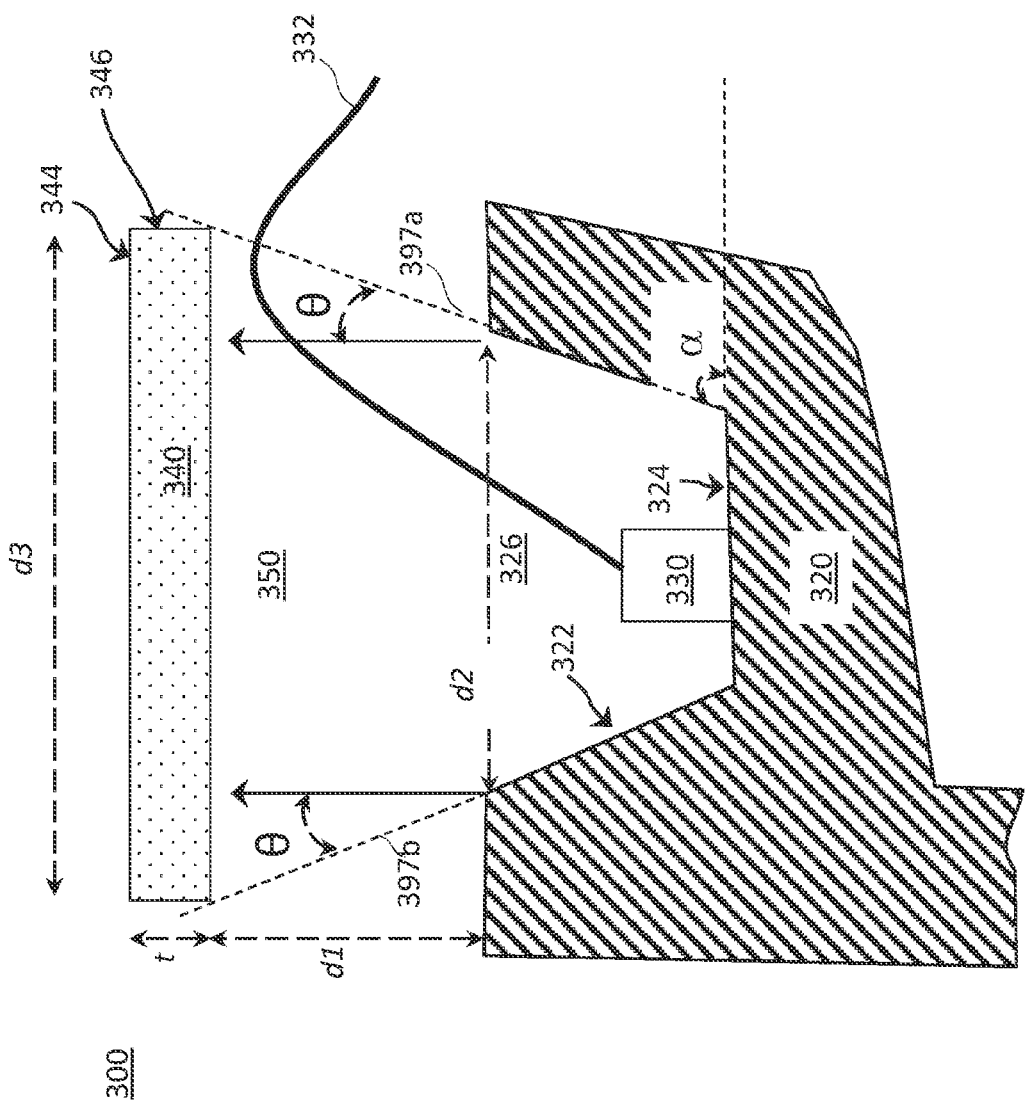
FIG. 3C illustrates a cross sectional view illustrating position of the wavelength-converting layer relative to a reflector cup.

Referring to FIG. 3C, the reflector cup 320 may comprise a reflective sidewall 322, a bottom reflective surface 324, an opening 326 located on an open end of the reflector cup 320 at a top, and a closed end at a bottom of the reflector cup 320. The reflector cup 320 may be shaped so as to direct light towards the first direction 398 along a longitudinal axis 399. The opening 326 of the reflector cup 320 may be configured to allow light to be transmitted towards the first direction 398.

The reflective sidewall 322 may have a conical shape. As shown in FIG. 3C, the reflective sidewall 322 may extend along a virtual surface depicted by virtual lines 397a and 397b in the cross-sectional view. The virtual lines 397a, 397b may form an acute angle θ with an axis parallel to the longitudinal axis 399. In other words, the reflective sidewall 322 may terminate at the open end and may be oriented at an angle α relative to the closed end. The angle α may be non-orthogonal relative to the closed end of the reflector cup 320. The sum of the angle α and the angle θ may be approximately ninety degrees.

The wavelength-converting layer 340 may be positioned at a distance d1 away from the reflector cup 320 measured along the longitudinal axis 399 from a top portion of the reflector cup 320. As can be observed from FIG. 2A, the wire bond 332 may have a first end coupled to the light source die 330 and a second end coupled to the conductor 312 located outside the reflector cup 320. Therefore, the wavelength-converting layer 340 may be positioned at d1 distanced away from a top of the reflector cup 320 so as to provide a space for the wire bond 332 to travel between the wavelength-converting layer 340 and the top of the reflector cup 320.

The opening 326 of the reflector cup 320 may have a diameter d2. The wavelength-converting layer 340 may have a diameter d3 extending between an outer-edge 346. As illustrated in FIG. 3C, the outer edge 346 that defines the diameter d3 of the wavelength-converting layer 340 may be distanced away and touching the virtual lines 397a, 397b. As shown in FIG. 3C, the outer edge 346 of the wavelength-converting layer 340 may be positioned to intersect a point above the reflector cup 320 that is determined by the distance d1 and the angle θ or the angle α. With this configuration, the reflector cup 320 may be configured to direct light towards the first direction 398.

Figure 4:
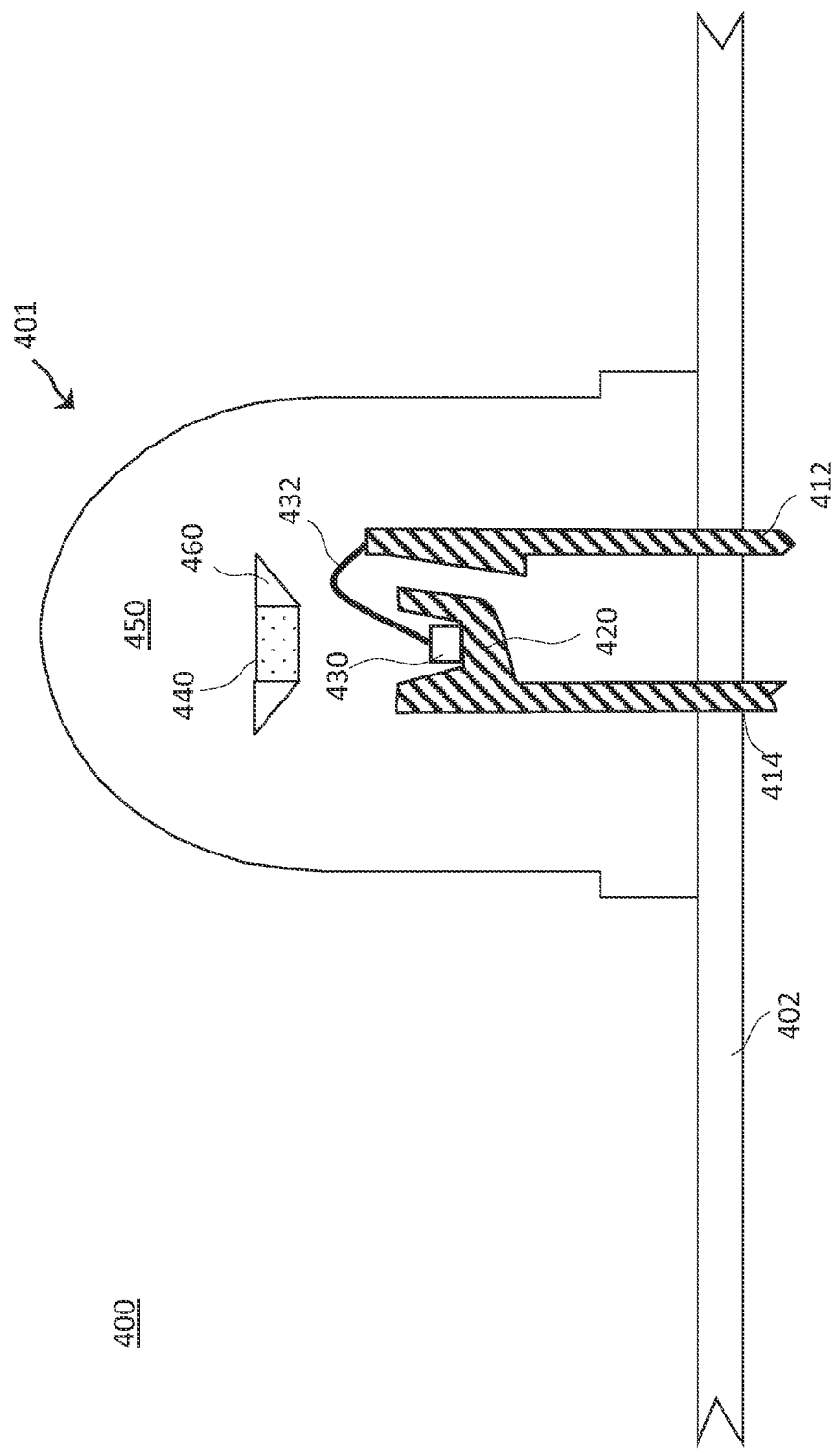
FIG. 4 illustrates a cross-sectional view of a display system.

FIG. 4 illustrates a cross-sectional view of a display system 400. The display system 400 may be a large scale infotainment display systems used in stadiums, streets or other locations to display information or advertisement to the public. The display system 400 may comprise a substrate 402, and at least one light-emitting device 401 arranged systematically in a two dimensional plane. The at least one light-emitting device 401 may the light-emitting devices 100, 200, 300 and 300 as shown in previous embodiments.

In one configuration where the display system 400 comprises a plurality of light-emitting device 401, each of the light-emitting devices 401 may not be identical. For example, some of the light-emitting devices 401 may be configured to emit different color of light. However, each of the light-emitting devices 401 may have a reflector cup 420, a light source die 430, a first encapsulant 450, an optional wavelength-converting layer 440, and an optical element 460.

Different aspects, embodiments or implementations may, but need not, yield one or more of the following advantages. For example, the size of the optical element and/or the reflective element may be intelligently selected to avoid yellow ring as illustrated above. Although specific embodiments of the invention have been described and illustrated herein above, the invention should not be limited to any specific forms or arrangements of parts so described and illustrated. For example, light source die described above may be LEDs die or some other future light source die as known or later developed without departing from the spirit of the invention. Likewise, although light-emitting devices were discussed, the embodiments are applicable to optical devices such as proximity sensor and encoders as well as component level such as a light-source packaging to produce the light-emitting devices. The scope of the invention is to be defined by the claims appended hereto and their equivalents.

What is claimed is:

1. A light-emitting device, comprising:
    a light source die;
    a base surface configured to receive the light source die;
    a reflective surface coupled to the base surface such that the reflective surface and the base surface are collectively configured to form a reflector cup extending in a longitudinal axis that is substantially perpendicular to the base surface; and
    a wavelength-converting layer positioned outside the reflector cup, the wavelength-converting layer comprising:
        a first surface facing the light source die and extending substantially in parallel with the base surface;
        at least one outer edge substantially perpendicular to the first surface; and
        an optical structure circumscribing the at least one outer edge of the first surface and configured to taper outwardly in a radial direction away from the wavelength-converting layer.

2. The light-emitting device of claim 1, wherein the reflector cup is configured to direct light emitted by the light source die towards a first direction and the optical structure is configured to reflect incident light emitted by the light source die away from the first direction.

3. The light-emitting device of claim 1, further comprising an encapsulant encapsulating the wavelength-converting layer and the optical structure, wherein the optical structure comprises an air pocket surrounded entirely within the encapsulant.

4. The light-emitting device of claim 1, wherein the optical structure comprises an air ring and wherein the wavelength-converting layer comprises a solid or semi-solid material.

5. The light-emitting device of claim 1, wherein the optical structure comprises a substantially flat surface adjacent to the first surface of the wavelength-converting layer and facing the light source die.

6. The light-emitting device of claim 1, wherein the wavelength-converting layer and the optical structure are coaxially aligned.

7. The light-emitting device of claim 1, wherein the optical structure comprises a reflective element that is concentrically arranged with the wavelength-converting layer and is in direct contact with the wavelength-converting layer.

8. The light-emitting device of claim 1, wherein:
    the wavelength-converting layer has a thickness measuring along the longitudinal axis; and
    the optical structure has a maximum thickness measuring along an axis in parallel to the longitudinal axis,
    wherein the maximum thickness of the optical structure is approximately equal to the thickness of the wavelength-converting layer.

9. The light-emitting device of claim 8, wherein the maximum thickness of the optical structure is located approximately at a boundary of the optical structure that is in direct contact with the wavelength-converting layer.

10. The light-emitting device of claim 1, further comprising a wire bond having a first end coupled to the light source die and a second end coupled to a conductor located outside the reflector cup, and wherein the wire bond is distanced away from the optical structure.

11. The light-emitting device of claim 1, wherein the optical structure and the wavelength-converting layer is distanced away from a top of the reflector cup so as to provide a space for a wire bond to travel between the wavelength-converting layer and the top of the reflector cup.

12. The light-emitting device of claim 1, wherein the reflective surface extends along a virtual surface oriented in an angle relative to the base surface, and wherein the virtual surface is in direct contact with the optical structure.

13. A lighting system comprising the light-emitting device of claim 1.

14. A light-emitting device, comprising:
    a reflector cup having a first end and a second end extending along a longitudinal axis, the reflector cup being configured to direct light towards a first direction;
    a light source die located at or near the first end of the reflector cup;
    a wavelength-converting layer positioned external to the reflector cup and adjacent to but distanced away from the second end of the reflector cup, the wavelength-converting layer having an outer perimeter; and
    a reflective element at least partially surrounding the outer perimeter of the wavelength-converting layer, wherein the reflective element is configured to taper outwardly in a radial direction away from the wavelength-converting layer.

15. The light-emitting device of claim 14, wherein the wavelength-converting layer comprises a first substantially flat surface facing the first direction and a second substantially flat surface facing the light source die.

16. The light-emitting device of claim 15, wherein the reflective element has a substantially flat surface.

17. The light-emitting device of claim 16, wherein the substantially flat surface of the reflective element is formed adjacent to the first substantially flat surface of the wavelength-converting layer facing the first direction.

18. The light-emitting device of claim 17, wherein the substantially flat surface of the reflective element and the first substantially flat surface of the wavelength-converting layer defines a continuous surface.

19. The light-emitting device of claim 16, wherein the substantially flat surface of the reflective element is formed adjacent to the second substantially flat surface of the wavelength converting material facing the light source die.

20. A light-emitting device, comprising:
- a reflector cup comprising a closed end and an open end, the reflector cup comprising a reflective surface that terminates at the open end and is oriented at an angle relative to the closed end, the angle being non-orthogonal relative to the closed end of the reflector cup;
- a light source die positioned within the reflector cup and closer to the closed end than the open end, the light source die being configured to emit light towards the open end of the reflector cup in addition to emitting light towards the reflective surface of the reflector cup;
- a wavelength-converting layer external to the reflector cup and positioned a predetermined distance away from the open end of the reflector cup, wherein the wavelength-converting layer comprises an outer edge that is positioned to intersect a point above the reflector cup that is determined by the predetermined distance and the angle; and
- an optical structure circumscribing the outer edge of the wavelength-converting layer and tapering outwardly in a radial direction away from the wavelength-converting layer.

* * * * *